July 23, 1963 R. P. MISRA 3,098,954
MESA TYPE TRANSISTOR AND METHOD OF FABRICATION THEREOF
Filed April 27, 1960
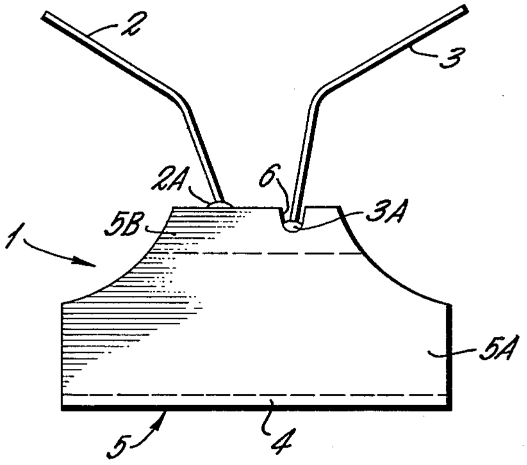
INVENTOR.
Raj P. Misra
BY
Stevens, Davis, Miller & Mosher
ATTORNEYS United States Patent Office 3,098,954

Patented July 23, 1963

3,098,954

MESA TYPE TRANSISTOR AND METHOD OF FABRICATION THEREOF

Raj P. Misra, West Caldwell, N.J., assignor to Texas Instruments Incorporated, Dallas, Tex., a corporation of Delaware Filed Apr. 27, 1960, Ser. No. 24,966
3 Claims. (Cl. 317—234)

This invention relates to the art of making transistors, and more particularly to a technique for producing mesa type transistors with improved injection efficiencies and lower values of base resistance, $r_{b'}$.

In practicing modern day transistor fabrication techniques, it is known to provide a layer of one conductivity type material on the surface of a wafer of semiconductor material of opposite conductivity type by diffusion processes. The upper surface of the diffused layer is then masked, and the semiconductor material is subjected to an etching process. In this manner, material is eroded or removed from the exposed or unmasked surfaces of the block by the etchant in order to produce a configuration which is referred to in the art as a mesa type transistor.

A base electrode is usually bonded to a base contact alloyed to one portion of the upper surface of the diffused layer of such mesa type transistor. The base contact forms an ohmic contact therewith. A collector contact may be formed by plating or metallically coating a portion of the semiconductor wafer which is characterized by a conductivity-type opposite to that of the diffused zone to which the base electrode is affixed. The emitter electrode of a mesa type transistor is attached to a rectifying contact formed on the upper surface of the diffused layer.

This method of constructing transistors has not provided optimum electrical performance. This is because the concentration gradient or diffusion gradient in the diffused layer is known to decrease in proportion to depth. The concentration gradient at the upper surface of the diffused layer will thus be relatively high, while the concentration at a point interiorly disposed within the wafer will be substantially lower. The resistivity gradient in a diffused layer exhibits exactly the opposite relationship. Next to the exposed upper surface of the diffused layer the resistivity is relatively low, and the value of resistivity becomes higher with increasing penetration into the diffused layer.

In prior art mesa type transistors, the location of the base and emitter electrodes directly on the upper surface of the diffused layer makes it impossible to secure a desirably low $r_{b'}$ value along with optimum injection efficiency. This is because the most efficient position for the base electrode in the diffusion gradient is not the best location for the emitter junction. According to the present invention, the ohmic contact formed by the base with the diffused layer is located directly in the low resistivity portion which characterizes the upper surface of the diffused layer. The emitter junction, on the other hand, is deliberately effected at the bottom of a depression or recess which is disposed to penetrate the diffused layer.

This selection of the best location for the base connection and emitter junction is made by placing the emitter in a minute cavity which may be formed by chemical jet etching, or other suitable techniques. As is known to those skilled in the art, such a cavity may be formed by eroding the material with a stream of ions which are accelerated through a gun which imparts high kinetic energies to the ions. Another method may be to focus a spot of light to accelerate etching, etc. In this manner, there is provided a mesa type transistor with a desirably low value of $r_{b'}$ as well as a superior value of injection efficiency.

Accordingly, therefore, a primary object of the present invention is to disclose a method of fabricating mesa type transistors which provides low values of $r_{b'}$ and high injection efficiency of the emitter.

Another object of this invention is to provide a technique for placing the base electrode and emitter junction in the diffusion gradient of a transistor in a manner which yields low values of $r_{b'}$, superior injection efficiencies and minimizes switching time.

These and other objects of the present invention will become apparent by referring to the accompanying single drawing and detailed description.

In the drawing, the numeral 1 has been used to designate generally a mesa type transistor. The transistor 1 is provided with the usual base electrode 2 attached to ohmic contact 2A, emitter electrode 3, and collector contact 4. The emitter electrode 3 is connected to the semiconductor wafer by way of an emitter contact dot 3A which may take the form of a suitable mass of metal which is alloyed, fused or otherwise joined to the transistor material to form a rectifying junction therewith. The collector contact 4 may comprise a plated or metallically coated layer on one surface of the transistor.

The base electrode 2, the emitter electrode 3, and the collector contact 4 illustrated in the drawing are each associated with a wafer of semiconductor material 5. The wafer of semiconductor material includes a lower portion 5A which may be, for example, of n-type conductivity. In the upper portion of the block, the numeral 5B has been used to designate a layer of semiconductor material of p-type conductivity. The layer 5B may be provided by means of conventional solid state diffusion techniques, or like methods.

As earlier mentioned in the present patent specification, an emitter dot 3A in the form of a quantity of metal is alloyed or otherwise joined to the bottom of a depression within the upper layer 5B to form a rectifying junction. Since the conductivity of the emitter dot 3A is n-type, provision for the alternate layers of n-p-n type material will be evident.

The emitter dot 3A is fused to the lower defining surface of a depression or recess identified by the reference numeral 6. The recess 6 may be formed by chemical jet etching, after the protected portions of the semiconductor material have been properly masked or coated with resist. The chemical action of the etching may be accelerated by the use of light, in a manner known to those skilled in the art.

Moreover, as earlier mentioned in the present specification, the depression 6 in the upper portion may be excavated by using rapidly travelling ions which are caused to impinge against the desired area with high velocities after traversing a conventional ion accelerator system.

In practicing the method of the invention, a wafer of semiconductor material 5 of one conductivity type such as n-type is first subjected to a diffusion process for the purpose of producing the zone 5B of p-type conductivity. The resistivity of the zone is, of course, graded and increases sharply in proportion to the depth of penetration into the upper portion. The concentration gradient, on the other hand, is maximum at the surface of the wafer and diminishes gradually in the direction of the interior of the wafer 5.

After formation of the diffused upper portion, the recess or depression 6 is then formed, and the emitter dot 3A is fused or joined to the bottom of the recess to form a rectifying junction with the p-type material. The base electrode 2 is affixed as shown to ohmic contact 2A attached to the surface of the upper layer. The collector contact 4 is located on the lower surface of the wafer, and may take the form of a layer of metallic material which has been plated or coated on the bottom of the wafer.

In this manner, placements for the base contact and emitter junction are provided which are correlated to the optimum location in the diffusion gradient of the p-layer material of the transistor. The injection efficiency of the resulting mesa type transistor is markedly superior to prior art transistors, and the switching time for the transistor may be reduced considerably.

In conclusion, it will now be evident that the invention is disclosed in such clear and concise terms as will enable those skilled in the art to practice and understand it. However, it will be equally evident that various modifications, substitutions and alterations may be made therein without departing from the spirit and scope of the appended claims.

What is claimed is:

1. A transistor device comprising:

(*a*) a wafer of semiconductor material predominately of one conductivity-type, (*b*) a diffused surface portion of the opposite conductivity-type on one major face of the wafer occupying only a limited area of said major face, said surface portion providing a varying resistance gradient which increases with depth, the interface between the surface portion and the remainder of the wafer defining a P-N junction which is substantially planar and generally parallel to said one major face, (*c*) a collector contact secured to the opposite major face of said wafer making ohmic connection to said semiconductor material of said one conductivity-type, (*d*) a base contact secured to said surface portion on said one major face, (*e*) an emitter contact secured within a depression defined entirely in said surface portion, said depression extending into said surface portion to a region adjacent to the P-N junction but not intersecting the P-N junction, said emitter contact making rectifying contact with said surface portion in a region having resistivity greater than that exhibited at the top surface of the surface portion.

2. A device according to claim 1 wherein said surface portion defines a raised mesa on said one major face of the wafer.

3. A device according to claim 2 wherein said emitter contact is an alloyed dot.

References Cited in the file of this patent

UNITED STATES PATENTS

| | | |
|---|---|---|
| 2,813,326 | Liebowitz | Nov. 19, 1957 |
| 2,836,878 | Shepard | June 3, 1958 |
| 2,837,703 | Lidow | June 3, 1958 |
| 2,849,342 | Webster | Aug. 26, 1958 |
| 2,863,105 | Ross | Dec. 2, 1958 |
| 2,956,913 | Mack et al. | Oct. 18, 1960 |
| 2,964,430 | Beale | Dec. 13, 1960 |
| 2,964,689 | Buschert et al. | Dec. 13, 1960 |
| 2,968,751 | Mueller et al. | Jan. 17, 1961 |